(12) United States Patent
Farrar

(10) Patent No.: US 6,284,656 B1
(45) Date of Patent: Sep. 4, 2001

(54) COPPER METALLURGY IN INTEGRATED CIRCUITS

(75) Inventor: Paul A. Farrar, So. Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/128,859

(22) Filed: Aug. 4, 1998

(51) Int. Cl.$^7$ .................................................. H01L 21/44
(52) U.S. Cl. ............................ 438/687; 438/623; 438/628
(58) Field of Search .................................. 438/687, 618, 438/622, 623, 625, 628, 654; 257/762, 642, 643

(56) References Cited

U.S. PATENT DOCUMENTS

| | | |
|---|---|---|
| 2,842,438 | 7/1958 | Saarivirta et al. . |
| 3,954,570 | 5/1976 | Shirk et al. .............................. 201/15 |
| 4,386,116 | 5/1983 | Nair et al. ................................ 427/99 |
| 4,423,547 | 1/1984 | Farrar et al. ............................. 29/571 |
| 4,574,095 | 3/1986 | Baum et al. ........................... 427/53.1 |
| 4,788,082 | 11/1988 | Schmitt ............................... 427/248.1 |
| 4,931,410 | 6/1990 | Tokunaga et al. .................... 437/189 |
| 4,962,058 | 10/1990 | Cronin et al. ......................... 437/187 |
| 4,996,584 | 2/1991 | Young et al. ............................ 357/71 |
| 5,019,531 | 5/1991 | Awaya et al. ......................... 437/180 |
| 5,100,499 | 3/1992 | Douglas ................................ 156/635 |

(List continued on next page.)

OTHER PUBLICATIONS

Tsukada, T., et al., "Adhesion of copper films on ABS polymers deposited in an internal magnet magnetron sputtering system", *J. Vac. Sci. Technol., 16 (2)*, pp. 348–351, (1979).

Chakravorty, K.K., et al., "High–Density Interconnection Using Photosensitive Polyimide and Electroplated Copper Conductor Lines", *IEEE Transactions on Components, Hybrids, and Manufacturing Technology, 13 (1)*, pp. 200–206, (Mar. 1990).

"Kirk–Othmer Concise Encyclopedia of Chemical Technology", *M. Grayson (ed), Wiley–Interscience, New York, NY*, 433–435, 926–938 (1985).

"Properties and Selection: Nonferrous Alloys and Pure Metals", *Metals Handbook Ninth Edition, 2, ASM International*, 157,395, (1979).

Abe, K., et al., "Sub–half Micron Copper Interconnects Using Reflow of Sputtered Copper Films", *VLSI Multilevel Interconnection Conference*, 308–314, (Jun. 25–27, 1995).

(List continued on next page.)

*Primary Examiner*—Sara Crane
(74) *Attorney, Agent, or Firm*—Schwegman, Lundberg, Woessner & Kluth, P.A.; Eduardo E. Drake

(57) ABSTRACT

A typical integrated circuit interconnects millions of microscopic transistors and resistors with aluminum wires buried in silicon-dioxide insulation. Yet, aluminum wires and silicon-dioxide insulation are less attractive than copper wires and polymer-based insulation, which promise both lower electrical resistance and capacitance and thus faster, more efficient circuits. Unfortunately, current techniques cannot realize the promise because copper reacts with the polymer-based insulation to form copper dioxide within the polymer, reducing effectiveness of the copper-polymer combination. Accordingly, the inventor devised a method which uses a non-acid-precursor to form a polymeric layer and then cures, or bakes, it in a non-oxidizing atmosphere, thereby making the layer resistant to copper-dioxidizing reactions. Afterward, the method applies a copper-adhesion material, such as zirconium, to the layer to promote adhesion with a subsequent copper layer. With reduced copper-dioxide, the resulting interconnective structure facilitates integrated circuits with better speed and efficiency.

25 Claims, 4 Drawing Sheets

U.S. PATENT DOCUMENTS

| | | | |
|---|---|---|---|
| 5,149,615 | 9/1992 | Chakravorty et al. | 430/313 |
| 5,158,986 | 10/1992 | Cha et al. | 521/82 |
| 5,173,442 | 12/1992 | Carey | 437/417 |
| 5,240,878 | 8/1993 | Fitzsimmons et al. | 437/187 |
| 5,243,222 | 9/1993 | Harper et al. | 257/774 |
| 5,256,205 | 10/1993 | Schmitt, III et al. | 118/723 |
| 5,334,356 | 8/1994 | Baldwin et al. | 422/133 |
| 5,354,712 | 10/1994 | Ho et al. | 437/195 |
| 5,426,330 | 6/1995 | Joshi et al. | 257/752 |
| 5,442,237 | 8/1995 | Hughes et al. | 257/759 |
| 5,470,789 | 11/1995 | Misawa | 437/190 |
| 5,470,801 | 11/1995 | Kapoor et al. | 437/238 |
| 5,476,817 | 12/1995 | Numata | 437/195 |
| 5,506,449 | 4/1996 | Nakano et al. | 257/758 |
| 5,529,956 | 6/1996 | Morishita | 437/195 |
| 5,538,922 | 7/1996 | Cooper et al. | 437/195 |
| 5,539,060 | 7/1996 | Tsunogae et al. | 525/338 |
| 5,625,232 | 4/1997 | Numata et al. | 257/758 |
| 5,635,253 | 6/1997 | Canaperi et al. | 427/437 |
| 5,662,788 | 9/1997 | Sandhu et al. | 205/87 |
| 5,674,787 | 10/1997 | Zhao et al. | 437/230 |
| 5,675,187 | 10/1997 | Numata et al. | 257/758 |
| 5,679,608 | 10/1997 | Cheung et al. | 437/195 |
| 5,681,441 | 10/1997 | Svendsen et al. | 205/114 |
| 5,695,810 | 12/1997 | Dubin et al. | 427/96 |
| 5,739,579 | 4/1998 | Chiang et al. | 257/635 |
| 5,780,358 | 7/1998 | Zhou | 438/645 |
| 5,785,570 | 7/1998 | Bruni | 445/52 |
| 5,792,522 | 8/1998 | Jin et al. | 427/575 |
| 5,801,098 | 9/1998 | Fiordalice et al. | 438/653 |
| 5,891,804 | 4/1999 | Havemann et al. | 438/674 |
| 5,893,752 | 4/1999 | Zhang et al. | 438/687 |
| 5,897,370 | 4/1999 | Joshi et al. | 438/632 |
| 5,911,113 | 6/1999 | Yao et al. | 438/649 |
| 5,913,147 | 6/1999 | Dubin et al. | 438/687 |
| 5,932,928 | 8/1999 | Clampitt | 257/758 |
| 5,933,758 | 8/1999 | Jain | 438/687 |
| 5,968,333 | 10/1999 | Nogami et al. | 205/184 |
| 5,969,422 | 10/1999 | Ting et al. | 257/762 |
| 5,972,804 | 10/1999 | Tobin et al. | 438/786 |
| 5,976,710 * | 11/1999 | Sachdev et al. | 428/620 |
| 5,981,350 | 11/1999 | Geusic et al. | 438/386 |
| 5,985,759 | 11/1999 | Kim et al. | 438/653 |
| 6,008,117 | 12/1999 | Hong et al. | 438/629 |
| 6,030,877 | 2/2000 | Lee et al. | 438/381 |
| 6,054,172 | 4/2000 | Robinson et al. | 427/97 |
| 6,069,068 * | 5/2000 | Rathore et al. | 438/628 |

OTHER PUBLICATIONS

Bai, G., et al., "Copper Interconnection Deposition Techniques and Integration", *1996 Symposium on VLSI Technology*, Digest of Technical Papers, 48–49, (1996).

Craig, J.D., "Polyimide Coatings", *Electronic Materials Handbook, ASM International, 1, Packaging*, 105, 768–772, (1989).

Ernst, et al., "Growth Model for Metal Films on Oxide Surface: Cu on ZnO(0001)–o", *Physical Review B*, vol. 47, No. 20, 13782–96, (1993).

Hirao, S., et al., "A Novel Copper Reflow Process Using Dual Wetting Layers", *1997 Symposium on VLSI Technology*, Digest of Technical Papers, 57–58, (1997).

Izaki, M., et al., "Characterization of Transparent Zinc Oxide Films Prepared by Electrochemical Reaction", *Journal of the Electrochemical Society, vol. 144, No. 6*, 1949–52, (Jun. 1997).

Jayaraj, K., et al., "Low Dielectric Constant Microcellular Foams", *Proceedings from the Seventh Meeting of the DuPont Symposium on Polymides in Microelectrics*, 474–501, (1996).

Jin, et al., "Porous Xerogel Films as Ultra–low Permitivity Dielectrics for AILS Interconnect Applications", *Advanced Metallization and Interconnect Systems for ULSI Applications*, Boston, MA, (Oct. 1996).

Kang, H.K., et al., "Grain Structure and Electromigration Properties of CVD CU Metallization", *Proceedings of the 10th International VLSI Multilevel Interconnection Conference*, 223–229, (Jun. 8–9, 1993).

Miller, et al., "Low Dielectric Constant Polyimides and Polyimide Nanofoams", *Seventh Meeting of the DuPont Symposium on Polymides in Microelectronics*, 443–473, (Sep. 1996).

Miyake, T., et al., "Atomic Hydrogen Enhanced Reflow of Copper", *Applied Physics Letters, vol. 70, No. 10*, 1239–41, (1997).

Park, C.W., et al., "Activation Energy for Electromigration in Cu Films", *Applied Physics Letters, vol. 59, No. 2*, 175, (1991).

Ramos, T., et al., "Nanoporous Silica for Dielectric Constant Less Than 2", *Advanced Metallization and Interconnect Systems for ULSI Applications*, Boston, MA, (1996).

Rossnagel, S.M., "Magnetron Sputter Deposition of Interconnect Applications", *Conference Proceedings, ULSI XI*, Materials Research Society, 227–32, (1996).

Srivatsa, A.R., et al., "Jet Vapor Deposition: an Alternative to Electrodeposition", *Surface Engineering, vol. 11, No. 1*, 75–77, (1995).

Tao, J., et al., "Electromigration Resistance of Copper Interconnects", *IEEE Electron Devices Letters, vol. 14, No. 5*, 249, (1993).

Ting, C.H., "Low K Material/Process Development", *Multilevel Interconnection State–of–the–Art Seminar*, Santa Clara, CA, 172–212, (Jun. 21, 1996).

Wang, X.W., et al., "Highly Reliable Silicon Nitride Thin Films Made by Jet Vapor Deposition", *Japanese Journal of Applied Physics 34, Pt. 1, No. 23*, 955–58, (1995).

Metals Handbook, 8th Edition 8, 300, 302, "Formation of Conductors at Variable Depths", *Research Disclosure*, Table of Contents, (Jul. 10, 1998).

"Improved Metallurgy for Wiring Very Large Scale Integrated Circuits", *International Technology Disclosures*, 4(9), (Sep. 25, 1986).

Braud, E., et al., "Ultra Thin Diffusion Barriers for Cu Interconnections at The Gigabit Generation and Beyond", *VMIC Conference Proceedings*, 174–179, (1996).

Ding, et al., "Copper Barrier, Seed Layer and Planerization Technologies", *VMIC Conference Proceedings*, 87–92, (1997).

Godbey, L.J., et al., "Copper Diffusion in Organic Polymer Resists and Inter–level Dielectrics", *International Conference on Metallurgical Coatings and Thin Films, Paper H2.04*, San Diego, CA To be published, 313, (Apr. 21–25, 1997).

Iijima, T., et al., "Microstructure and Electrical Properties of Amorphous W–Si–N Barrier Layer for Cu Interconnections", 168–173, (1996).

Laursen, T., et al., "Encapsulation of Copper by Nitridation of Cu–Ti Alloy/Bilayer Structures", *International Conference on Metallurgical Coatings and Thin Films, Paper H1.03*, San Diego, CA, 309, (Apr. 21–25, 1997).

Murarka, S.P., et al., "Copper Interconnection Schemes: Elimination of The Need of Diffusion Barrier/Adhesion Promoter by the Use of Corrosion Resistant, Low Resistivity Doped Copper", *SPIE, 2335*, 80–90, (Oct. 20–21, 1994).

Saarivirta, M.J., "High Conductivity Copper Rich Cu–Zr Alloys", *Trans Met. Soc. AIME 218*, 413–437, (1960).

Shacham–Diamand, Y., "100 nm Wide Copper Lines Made by Selective Electroless Depositionp", *Journal of Micromechancis and Microengineering, 1(1)*, 66–72, (Mar. 1991).

Van Vlack, L.H., "Elements of Materials Science", Addison–Wesley Publishing Co., Inc. Reading, MA, 468, (1959).

Wolf, S., "Silicon Processing for the VLSI Era", *Process Technology, 1*Lattice Press, Sunset Beach, CA, 514–538, (1986).

Palleau, J., et al., "Refractory Metal Encapsulation in Copper Wiring", *Advanced Metallization for Devices and Circuits–Science, Technology and Manufacturability, Materials Research Society Symposium Proceedings, 337*, pp. 225–231, (Apr. 1994).

Godbey, D.J., et al., "Copper Diffusion in Organic Polymer Resists and Inter–level Dielectrics", *thin solid films—An International Journal on the Science and Technology of Condensed Matter Films, vol. 308–309*, San Diego, CA, pp. 470–474, (Apr. 21–25, 1997).

\* cited by examiner

COPPER METALLURGY IN INTEGRATED CIRCUITS

FIELD OF INVENTION

The present invention concerns methods of fabricating integrated circuits, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together to define a specific electric circuit, such as a computer memory.

Interconnecting millions of microscopic components typically entails covering the components with an insulative layer of silicon dioxide, etching small holes in the insulative layer to expose portions of the components underneath, and digging trenches in the layer to define a wiring pattern. Then, through metallization, the holes and trenches are filled typically with aluminum, to form line-like aluminum wires between the components. The aluminum wires are typically about one micron thick, or about 100 times thinner than a human hair.

Silicon dioxide and aluminum are the most common insulative and conductive materials used to form interconnections today. However, at sub-micron dimensions, that is, dimensions appreciable less than one micron, aluminum and silicon-dioxide interconnection systems present higher electrical resistances and capacitances which waste power and slow down integrated circuits. Moreover, at these smaller dimensions, aluminum exhibits poor electromigration resistance, a phenomenon which promotes disintegration of the aluminum wires at certain current levels. This ultimately undermines reliability, not only because disintegrating wires eventually break electrical connections but also because aluminum diffuses through surrounding silcon-dioxide insulation to form short circuits with neighboring wires. Thus, at submicon dimensions, aluminum and silicon-dioxide interconnection systems waste power, slow down integrated circuits, and compromise reliability.

Copper appears, because of its lower electrical resistivity and higher electromigration resistance to be a promising substitute for aluminum. And, many polymers, for example, fluorinated polyimides, because of their lower dielectric constants, appear to be promising substitutes for silicon dioxide. Thus, a marriage of copper with these polymers promises to yield low-resistance, low-capacitance interconnective structures that will improve the efficiency and speed of integrated circuits.

Unfortunately, copper reacts with these polymers to form conductive copper dioxide within these polymers, reducing their effectiveness as low-capacitance insulators and ultimately leaving the copper-polymer promise of superior efficiency and speed unfulfilled.

SUMMARY OF THE INVENTION

To address these and other needs, the inventor has developed methods of making copper-polymer interconnection systems with reduced copper oxide. Specifically, one method uses a non-acid-based polymeric precursor, such as ester, instead of the typical acid precursor, to form a polymeric layer, and then cures the layer in a reducing or non-oxidizing atmosphere, thereby making the layer resistant to oxidation. Afterward, a zirconium, hafnium, or titanium layer is formed on the polymeric layer to promote adhesion with a subsequent copper layer. With the reduced formation of copper oxide, the method yields faster and more efficient copper-polymer interconnects.

Moreover, reducing copper-dioxidation facilitates micron and sub-micron spacing of polymer-insulated copper conductors, which would otherwise require spacings of 10 or more microns. Accordingly, another aspect of the invention is an integrated circuit including at least two conductors which are separated by no more than about one micron of a polymeric insulator. Thus, the inventor provides a method that not only yields copper-polymer interconnects of superior speed and efficiency, but also yields integrated circuits with unprecedented spacing of copper-polymer interconnects.

BRIEF DESCRIPTION OF THE DRAWINGS

The invention is described with reference to the following figures, wherein like numerals refer to like features.

DETAILED DESCRIPTION OF PREFERRED EMBODIMENTS

The following detailed description, which references and incorporates FIGS. 1–11, describes and illustrates one or more specific embodiments of the invention. These embodiments, offered not to limit but only to exemplify and teach the invention, are shown and described in sufficient detail to enable those skilled in the art to practice the invention. Thus, where appropriate to avoid obscuring the invention, the description may omit certain information known to those of skill in the art.

Figure 1:
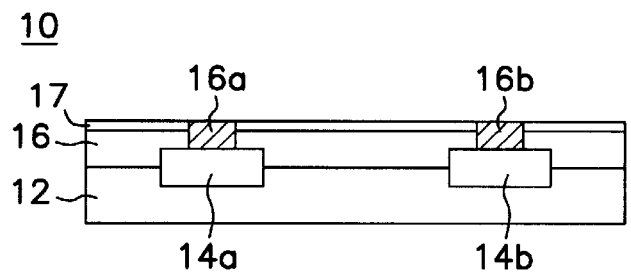
FIG. 1 is a cross-sectional view of an integrated-circuit assembly at an early fabrication stage, including transistors 14a and 14b, an insulative layer 16, contacts 16a and 16b, and a silicon nitride layer 17.

FIGS. 1–9 show a number of exemplary integrated-circuit assemblies, which taken collectively and sequentially, illustrate an exemplary method of the present invention. The method, as shown in FIG. 1, a cross-sectional view, begins with a known integrated-circuit assembly or structure 11, which can be within any integrated circuit, an integrated memory circuit, for example. Assembly 11 includes a substrate 12. The term "substrate," as used herein, encompasses a semiconductor wafer as well as structures having one or more insulative, semi-insulative, conductive, or semiconductive layers and materials. Thus, for example, the term embraces silicon-on-insulator, silicon-on-sapphire, and other advanced structures.

Substrate 12 supports a number of integrated elements 14, such as transistors 14a and 14b. Transistors 14a and 14b are covered by a 100-nanometer-thick, insulative layer 16, which, for example, comprises a silicon oxide. A silicon-nitride layer 17, also 100-nanometers thick, covers layer 16. Extending through layers 16 and 17 are two tungsten vias (or contact plugs) 16a and 16b electrically connected to respective transistors 14a and 14b. Although omitted from FIGS. 1–9 for clarity, assembly 11 preferably includes a titanium-nitride (TiN) diffusion barrier between vias 16a and 16b and transistors 14a and 14b.

Figure 2:
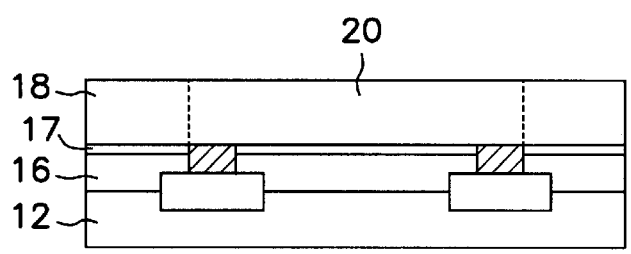
FIG. 2 is a cross-sectional view of the FIG. 1 integrated-circuit assembly after formation of a polymeric layer 18 over contacts 16a and 16b and layer 17 and after formation of a trench 20.

FIG. 2 shows that the first step of the exemplary method entails forming a polymeric layer 18 atop layer 17. As used herein, the term "polymeric" encompasses organic polymers, organic oligomers, and organic monomers. Collectively, these may be described as materials containing one or more mer units having a carbon-chain backbone. In addition, "polymeric" encompasses materials having properties similar to those of organic polymers. For instance, organic polymers characteristically have high ductility, low elastic modulus, low compressive-yield strength, and/or low thermal-expansion coefficients. Moreover, as used herein, polymeric encompasses polymer precursors, or bases.

In the exemplary embodiment, polymeric layer 18 begins as a non-acid polymeric precursor, that is, a precursor with a pH greater than about 6. Examples of polymeric precursors include a polyimide ester, such as the type sold by E.I. du Pont de Nemours under the tradename PI-2801, or a polymeric-precursor derivative based on fluorine, bromine, or other elements from the fluorine periodic group. Other embodiments form polymeric layer 18 as a foamed polymer, which will generally have a lower dielectric constant than most non-foamed polymers and thus provides further capacitance reductions. An example of a foamed polymer is taught in co-pending and co-assigned patent application Ser. No. 08/892,114 filed Jul. 14, 1997. This application, entitled Method of Forming Insulating Material for an Integrated Circuit and Integrated Circuits Resulting from Same, is incorporated herein by reference.

Subsequent to its formation from a non-acid precursor, polymeric layer 18 is cured, with the resultant layer having a thickness of about 500 nanometers. In the exemplary embodiment, the curing procedure has three phases: the first at 125° C. for 15 minutes, the second at 250° C. for 30 minutes, and the third at 375° C. for 30 minutes, with the second and third phases occurring in a non-oxidizing, or reducing, atmosphere to inhibit oxidation. Some exemplary atmospheres are pure hydrogen or mixtures of about 3-to-10% hydrogen with nitrogen, argon, or helium. Starting with the non-acid precursor and curing according to this procedure ultimately reduces the amount of oxidization that occurs in subsequent processing by about four fold. Therefore, unlike conventional polymeric processing, this procedure prevents or reduces increases in the dielectric constant of polymeric layer 18.

Figure 3:
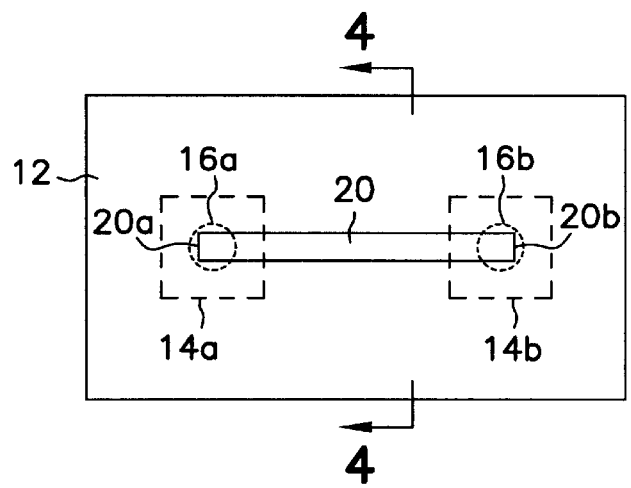
FIG. 3 is a top view of the FIG. 2 integrated-circuit assembly, showing position of the trench relative contacts 16a and 16b.
Figure 4:
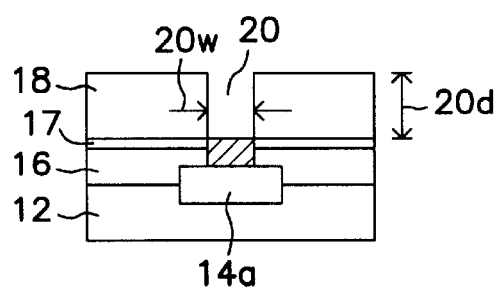
FIG. 4 is another cross-sectional view of the FIG. 3 integrated-circuit assembly, taken along line 4—4 to show depth and width of the trench.

The next step, best illustrated in FIG. 3, a top view of the FIG. 2 assembly, is to define the stud and wiring patterns on layer 18, using for example suitable masking and etching techniques. In the exemplary embodiment, this entails using reactive-ion etching or any selective-material-removal technique to form a trench 20, which will ultimately define a conductor for connecting vias 16a and 16b. FIG. 3 shows that trench 20 has ends 20a and 20b which correspond with respective vias 16a and 16b. FIG. 4, a cross-section of assembly 11 taken along line 4—4 in FIG. 3, shows that trench 20 has a depth 20d of about 500 nanometers to expose vias 16a and 16b, and a width 20w of about 250 nanometers. Thus, in this exemplary embodiment, trench 20 has an approximate aspect ratio of 2-to-1.

Figure 5:
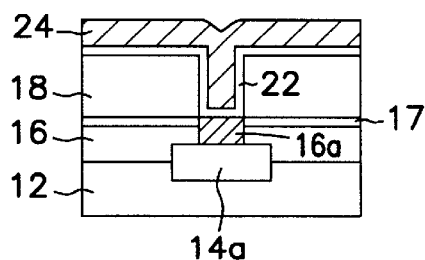
FIG. 5 is a cross-sectional view of the FIG. 4 assembly after formation of a copper-adhesion layer 22 and a copper layer 24.

The next step, shown in FIG. 5, entails applying a 10-nanometer-thick adhesion layer 22 on layer 18, inside and outside trench 20. The principle purpose of the adhesion layer, which may also be called a seed, contact, or cladding layer, is to promote adherence of a copper layer formed in the next step. Examples of suitable adhesion-layer materials include zirconium, hafnium, titanium. Zirconium, however, is preferable to titanium since it has at least a ten-fold lower solubility in copper.

Next, to form a copper conductor, the method fills trench 20, as FIG. 5 shows, by depositing a 975-nanometer-thick copper layer 24 on layer 22 and inside trench 20. In some embodiments another 10-nanometer-thick adhesion layer is formed atop copper layer 24 to inhibit copper oxidation during later processing, particularly during curing of subsequent polymeric layers. To reduce copper oxidation, one embodiment performs the adhesion-material and the copper deposition at temperatures less than 450° C., another embodiment at temperatures between about 250 and 350° C., and another at around 300° C.

In the 250–350° C. range, a thin layer of $Cu_5Zr$ (or Beta), tends to initially form at the interface of the copper and zirconium layers, inhibiting diffusion of zirconium into the copper and preventing it from significantly increasing resistance of the copper. A similar effect may be achieved by electroplating the copper and heat-treating the zirconium and copper layers at 250–350° C. for one to two hours, before curing the polymer. Inhibiting the diffusion of zirconium into the copper ultimately yields a copper conductor with a conductivity greater than 95 percent of IACS, or International Annealed Copper Standard. The International Annealed Copper Standard (IACS) is 1.7241 microhm-centimeters at 20 C, or 17.241 nanaohm-meters. Thus, the exemplary copper conductor has a conductivity greater than about 16.4 nanaohm-meters. However, in other embodiments the conductor is in the range of 14 nanohm-meters or greater.

Figure 6:
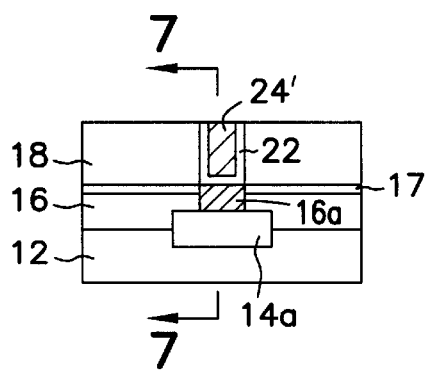
FIG. 6 is a cross-sectional view of the FIG. 5 assembly after removal of excess portions of layers 22 and 24 leaves copper conductor 24'.

Afterwards, excess copper and zirconium on the surface are then removed using a chemical-mechanical polishing technique. FIG. 6 shows the resulting metal conductor 24', which electrically connects vias 16a and 16b and therefore connects transistors 14a and 14b. Formation of conductor 24' completes the first level of metallization.

Figure 7:
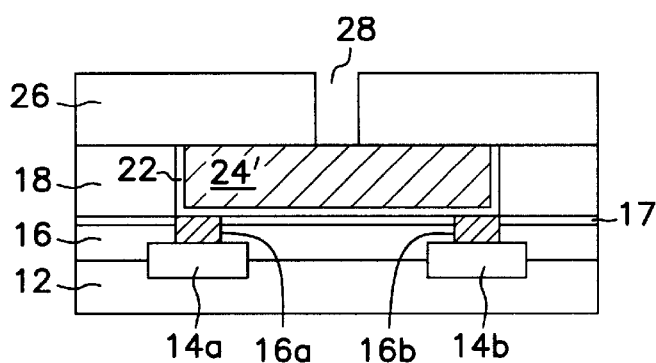
FIG. 7 is a cross-sectional view of the FIG. 6 assembly taken along line 7—7 after formation of another polymeric layer 26 having a via hole 28.

FIG. 7 shows that the second level metallization starts with formation and curing of a second polymeric layer 28 on layer 22. In some embodiments, layer 28 has a composition similar to polymeric layer 18. Subsequently, the method cures layer 28, again following a three-phase curing procedure with temperatures similar to those used for layer 18. The first phase preferably occurs in hydrogen, high-purity forming gas, or a non-oxidizing high-purity argon, and the second and third phases preferably occur in a non-oxidizing atmosphere of high-purity argon. In contrast to conventional curing procedures, this curing procedure, devised primarily for second and subsequent polymeric layers, takes particular care to avoid inciting reactions with and between existing polymeric and copper structures, for example, layer 18 and conductor 24'. Therefore, this procedure safeguards the dielectric strength of polymeric layer 18.

Figure 8:
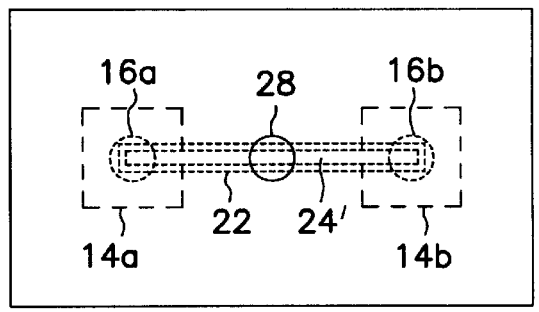
FIG. 8 is a top view of the FIG. 7 assembly, showing position of the via hole relative conductor 24'.

After curing polymeric layer 28, the method defines a stud and/or wiring pattern using any suitable technique. The exemplary embodiment defines a vertical stud, or via, hole 28a in layer 28, using masking and etching techniques. (Hole 28a may also be viewed as the cross-section of a trench, defining a wire that intersects, or contacts, copper conductor 24' which lies below.) Other embodiments form hole 28a along with other wiring trenches similar to trench 20, according to conventional dual-damascene techniques, which fill via holes and trenches in one metallization. FIG. 8 shows the position of hole 28a relative transistors 14a and 14b, vias 16a and 16b, and conductor 24' from the first metallization level.

The next steps form a 10-nanometer-thick adhesion layer 30, similar to adhesion layer 22, on polymeric layer 28, as well as a copper layer 32 on layer 28. (Other embodiments form an additional adhesion layer on copper layer 32.) Layers 30 and 32, in the exemplary embodiment, are deposited at approximately 300° C. As already noted, depositing zirconium and copper at this temperature tends to form a thin interfacial layer of $Cu_5Zr$ (not shown) between layers 30 and 32, which ultimately enhances conductivity of the resulting conductor. Subsequent annealing also promotes formation of this interfacial layer.

Figure 9:
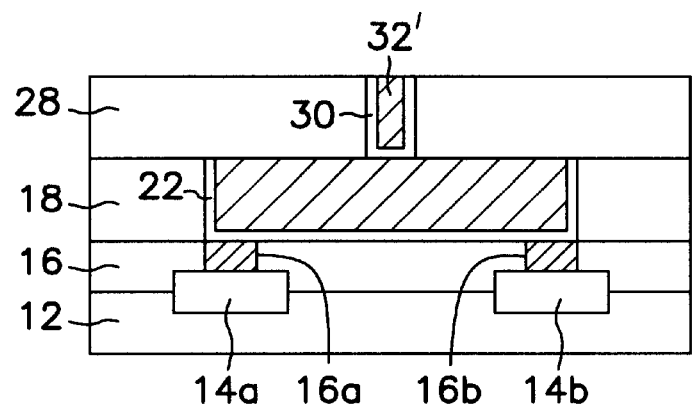
FIG. 9 is a cross-sectional view of the FIG. 8 assembly after formation of a copper-adhesion layer 30 and copper contact 32.

After completion of layer 32, excess copper and adhesion-layer material are removed, for example, by chemical-mechanical polishing. FIG. 9 shows that the resulting integrated-circuit assembly includes a copper via 34' electrically connected to underlying conductor 24' and thus also connected to transistors 14a and 14b. Subsequent metallizations would follow similarly.

Figure 10:
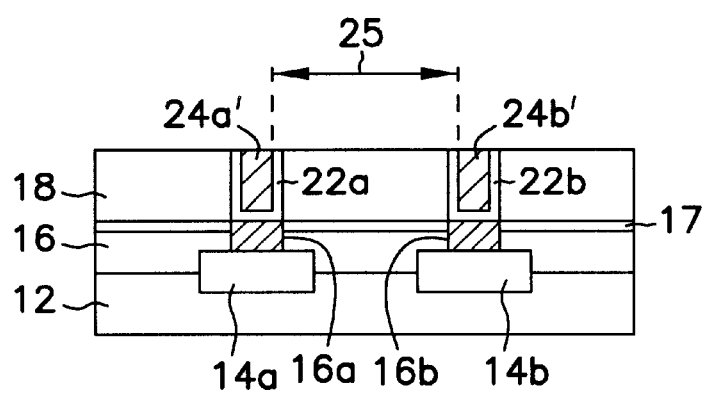
FIG. 10 is a cross-sectional view of an integrated-circuit assembly having two copper conductors 24a' and 24b' in a polymeric insulator 18, with the conductors separated by no more than about one micron.

In addition to preservation of the dielectric constant of the polymeric layers, the oxidation reductions stemming from the present invention also allow closer spacing of copper conductors in polymeric insulators, particularly micron and submicron spacing. FIG. 10, a juxtaposition of two of the assemblies shown in FIG. 6, shows two side-by-side copper structures (for example contact plugs or wires) 24a' and 24b' separated by a distance 25 which is less than about one micron in one embodiment. In various embodiments, distance 25 is less than about 0.75 microns, less than about 0.5 microns, or less than about 0.25 microns. In contrast, conventional techniques for forming copper-polymer interconnections require intrapolymer conductor spacings of 20 or more microns to maintain isolation of the conductors after uninhibited formation of conductive copper dioxide in the polymer between conductors. Thus, the micron and submicron spacings of the present invention provide a dramatic improvement.

Figure 11:
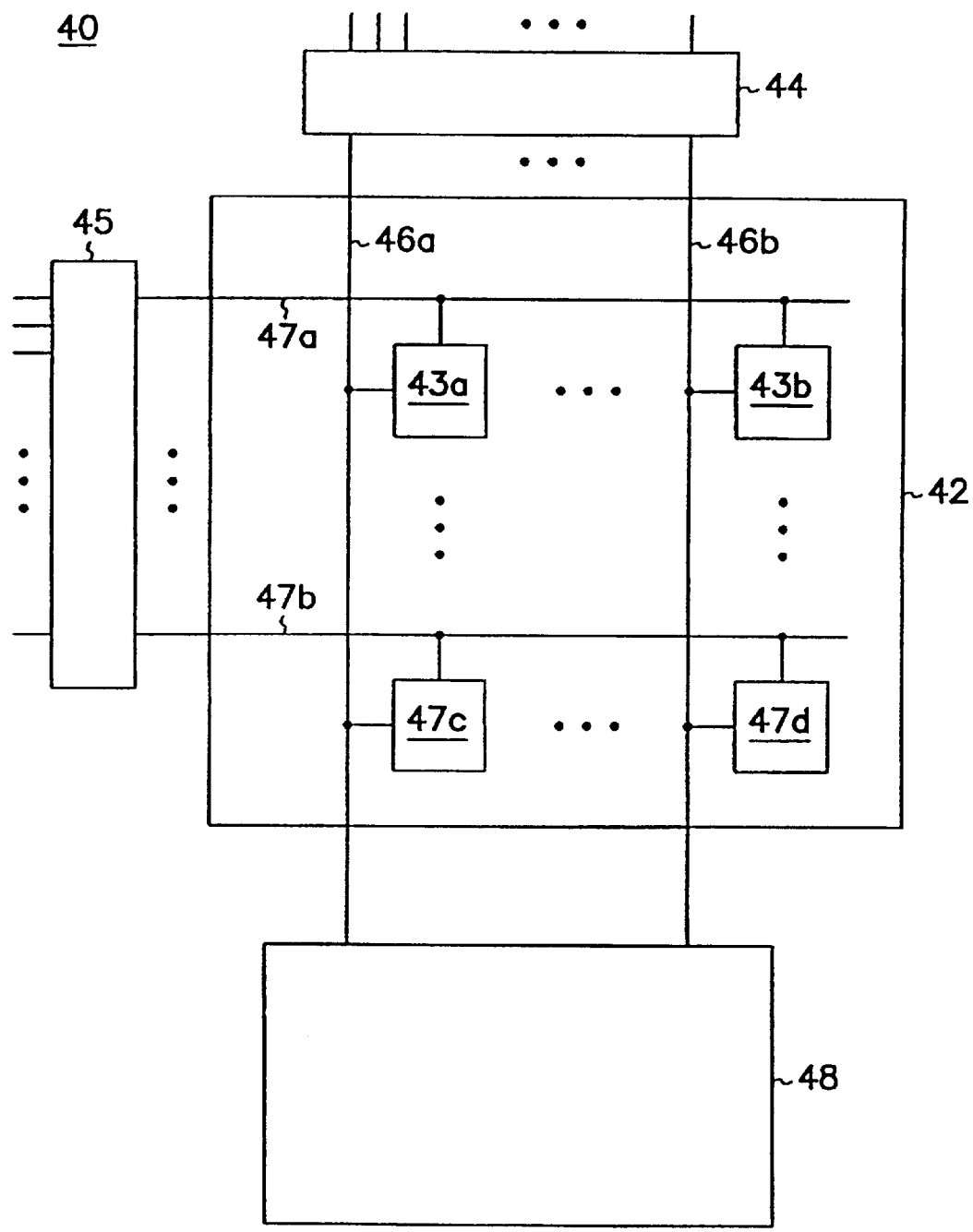
FIG. 11 is a block diagram of an integrated memory circuit which incorporates the present invention.

Exemplary Embodiment of an Integrated Memory Circuit Incorporating the Copper-Polymer Interconnection System FIG. 11 shows one example of the unlimited number of applications for the copper-polymer interconnections of the present invention: a generic integrated memory circuit 40. Circuit 40, which operates according to well-known and understood principles, is generally coupled to a processor (not shown) to form a computer system. More precisely, circuit 40 includes a memory array 42 which comprises a number of memory cells 43, a column address decoder 44, and a row address decoder 45, bit lines 46, word lines 47, and voltage-sense-amplifier circuit 48 coupled to bit lines 46.

In the exemplary embodiment, each of the memory cells, the address decoders, and the amplifier circuit includes two or more zirconium-clad copper conductors embedded in polymeric insulation according to the present invention. In addition, connections between the address decoders, the memory array, the amplifier circuit are implemented using similar copper-polymer interconnects. The spacings of these conductors, in some embodiments, follow the micron and submicron spacings noted for FIG. 10.

CONCLUSION

The present invention provides a method of forming copper-polymer interconnections systems, which reduces the tendency of polymers to react with copper and form undesirable copper oxides. Formation of these copper oxides would otherwise reduce the effectiveness of the polymers as low-capacitance insulators and thus offset their ability to improve speed and efficiency of integrated circuits. Thus, the present invention ultimately facilitates the fabrication of integrated circuits having superior speed and efficiency. Moreover, because the reduction in oxidation allows closer placement of polymer-insulated copper wires, the invention also facilitates denser integrated circuits, that is, circuits with greater numbers of components in the same space.

The embodiments described above are intended only to illustrate and teach one or more ways of practicing or implementing the present invention, not to restrict its breadth or scope. The actual scope of the invention, which encompasses all ways of practicing or implementing the invention, is defined only by the following claims and their equivalents.

What is claimed is:

1. A method of making copper-polymer-based interconnections in an integrated circuit, the method comprising:
   applying a non-acidic polymeric precursor to a surface in the integrated-circuit assembly;
   curing the applied non-acidic polymeric precursor in a non-oxidizing atmosphere to form a polymeric layer;
   forming a first copper-adhesion layer on the polymeric layer;
   forming at least one copper structure on the first copper-adhesion layer; and
   forming a second copper-adhesion layer on the one copper structure.

2. The method of claim 1 wherein applying a non-acidic polymeric precursor to a surface in the integrated-circuit assembly; applying a polyimide ester to a layer in the integrated-circuit assembly.

3. The method of claim 1 wherein the polymeric layer comprises a polyimide.

4. The method of claim 1:
   wherein forming the first copper-adhesion layer comprises depositing at least one of zirconium, hafnium, or titanium on the polymeric layer; and
   wherein forming the second copper-adhesion layer comprises depositing at least one zirconium, hafnium, or titanium on the one copper structure.

5. The method of claim 4 wherein forming the one copper structure on the polymeric layer comprises depositing copper within an approximate temperature range of 250 to 350° C.

6. The method of claim 1 wherein the non-oxidizing atmosphere comprises at least one of hydrogen, nitrogen, or argon.

7. The method of claim 1 further comprising:
applying a non-acidic polymeric precursor to a surface over the one copper structure in the integrated-circuit assembly;
curing the applied non-acidic precursor in an argon atmosphere to form another polymeric layer; and
forming another copper structure on the other polymeric layer.

8. The method of claim 1 wherein forming the copper structure occurs after curing the non-acidic polymeric precursor.

9. A method of making copper-polymer-based interconnections in an integrated circuit, the method comprising:
applying a non-acidic polymeric precursor to a layer in the integrated-circuit assembly;
curing the polymeric precursor in a non-oxidizing atmosphere to form a polymeric layer;
applying a copper-adhesion material to the polymeric layer, the copper-adhesion material consisting essentially of hafnium or zirconium; and
forming at least one copper structure that contacts the copper-adhesion material on the polymeric layer.

10. The method of claim 9 wherein applying the non-acidic polymeric precursor comprises applying a polyimide ester to the layer in the integrated-circuit assembly.

11. The method of claim 9 wherein the polymeric layer comprises a polyimide.

12. The method of claim 9 wherein forming the one copper structure on the polymeric layer comprises:
depositing copper on the copper-adhesion layer at a deposition temperature in a range of 250 to 350° C.

13. The method of claim 9 further comprising:
applying a non-acidic polymeric precursor to a surface over the one copper structure in the integrated-circuit assembly;
curing the applied non-acidic precursor in an argon atmosphere to form another polymeric layer; and
forming another copper structure on the other polymeric layer.

14. The method of claim 9 wherein forming the one copper structure occurs after curing the non-acid-based polymeric layer in a non-oxidizing environment.

15. A method of making copper-polymer-based interconnections in an integrated circuit, the method comprising:
applying a polyimide ester to a layer in the integrated-circuit assembly;
curing the applied polyimide ester in a non-oxidizing atmosphere to form a polyimide layer;
applying a copper-adhesion material to the polyimide layer, wherein the copper-adhesion material comprises at least one of zirconium and hafnium; and
depositing copper on the copper-adhesion material on the polyimide layer; and
applying a copper-adhesion material to the deposited copper, wherein the copper-adhesion material comprises at least one of zirconium and hafnium.

16. The method of claim 15 wherein applying the copper-adhesion material comprises depositing zirconium within an approximate temperature range of 250 to 350° C.

17. The method of claim 15 wherein depositing copper occurs after curing the polyimide ester.

18. A method of making copper-polymer-based interconnections in an integrated circuit, the method comprising:
forming a first polymeric layer in the integrated-circuit assembly from a non-acidic polymeric precursor;
forming a first copper-adhesion layer on the first polymeric layer;
forming at least one copper structure on the first copper-adhesion layer;
forming a second copper-adhesion layer on the one copper structure;
forming a second polymeric layer in the integrated-circuit assembly from a non-acidic polymeric precursor;
forming a third copper-adhesion layer on the second polymeric layer;
depositing copper on the third copper-adhesion layer at a temperature less than about 450° C.

19. The method of claim 18 wherein the first, second, and third copper-adhesion layers comprise at least one of zirconium, titanium, and hafnium.

20. The method of claim 18 wherein depositing copper occurs within an approximate temperature range of 250 to 350° C.

21. The method of claim 18 wherein the non-oxidizing atmosphere comprises at least one of hydrogen, nitrogen, and argon.

22. A method of electrically connecting first and second components in an integrated-circuit assembly, the method comprising:
applying a polyimide ester to a layer over the first and second components;
curing the polyimide ester in a non-oxidizing atmosphere to form a polyimide layer;
forming a trench in the polyimide layer, the trench having respective first and second regions overlying the first and second components;
depositing a copper-adhesion material in the trench;
at least partially filling the trench with copper; and
depositing copper-adhesion material on the copper in the trench.

23. The method of claim 22 wherein the copper-adhesion material comprises at least one of zirconium, hafnium, or titanium.

24. The method of claim 22 wherein depositing the copper-adhesion material and depositing the copper occur within an approximate temperature range of 250 to 350° C.

25. The method of claim 22 wherein depositing the copper occurs after curing the polyimide ester.

* * * * *